(12) United States Patent
Lei et al.

(10) Patent No.: US 11,380,677 B2
(45) Date of Patent: Jul. 5, 2022

(54) TRANSISTOR DEVICES AND METHODS OF FORMING A TRANSISTOR DEVICE

(71) Applicant: GLOBALFOUNDRIES Singapore Pte. Ltd., Singapore (SG)

(72) Inventors: Jiacheng Lei, Singapore (SG); Lawrence Selvaraj Susai, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 16/860,087

(22) Filed: Apr. 28, 2020

(65) Prior Publication Data
US 2021/0335778 A1    Oct. 28, 2021

(51) Int. Cl.
| | |
|---|---|
| *H01L 29/778* | (2006.01) |
| *H01L 27/06* | (2006.01) |
| *H01L 29/20* | (2006.01) |
| *H01L 29/205* | (2006.01) |
| *H01L 29/423* | (2006.01) |

(Continued)

(52) U.S. Cl.
CPC .... *H01L 27/0605* (2013.01); *H01L 21/28264* (2013.01); *H01L 21/30612* (2013.01); *H01L 21/32133* (2013.01); *H01L 21/8252* (2013.01); *H01L 27/0629* (2013.01); *H01L 29/2003* (2013.01); *H01L 29/205* (2013.01); *H01L 29/4236* (2013.01); *H01L 29/66143* (2013.01); *H01L 29/66462* (2013.01); *H01L 29/7786* (2013.01); *H01L 29/872* (2013.01)

(58) Field of Classification Search
CPC ............ H01L 29/7786; H01L 29/7787; H01L 29/872; H01L 29/0605; H01L 29/66462
See application file for complete search history.

(56) References Cited

U.S. PATENT DOCUMENTS

| | | | |
|---|---|---|---|
| 9,553,152 B2 * | 1/2017 | Ohki .................... | H01L 29/1045 |
| 2009/0072272 A1 * | 3/2009 | Suh ...................... | H01L 29/7787 257/E21.409 |

(Continued)

OTHER PUBLICATIONS

Color copy of Lei, J. "An Interdigitated GaN MIS-HEMT/SBD Normally-Off Power Switching Device with Low ON-resistance and Low Reverse Conduction Loss" IEEE In. Elec. Dev. Meet. IEDM 2017 Jan. 25, 2018 pp. 25.2.1-25.2.4 (Year: 2018).*

(Continued)

*Primary Examiner* — Grant S Withers
(74) *Attorney, Agent, or Firm* — Viering Jentschura & Partner MBB

(57) ABSTRACT

According to various embodiments, a transistor device may include a semiconductor structure having a trench formed therein. The semiconductor structure may include a buffer layer and a barrier layer arranged over the buffer layer. The trench may extend at least to the buffer layer. The transistor device may include a source terminal, a drain terminal, and a gate terminal arranged between the source terminal and the drain terminal. The gate terminal may extend into the trench. The transistor device may include an electrode component. The electrode component may include an electrode. The electrode component may extend into the trench where the electrode component is separated from the gate terminal. The electrode component may contact a side wall of the trench.

20 Claims, 15 Drawing Sheets

(51) Int. Cl.
  *H01L 21/8252* (2006.01)
  *H01L 29/66* (2006.01)
  *H01L 21/28* (2006.01)
  *H01L 21/306* (2006.01)
  *H01L 21/3213* (2006.01)
  *H01L 29/872* (2006.01)

(56) References Cited

U.S. PATENT DOCUMENTS

| | | | | |
|---|---|---|---|---|
| 2011/0227093 | A1* | 9/2011 | Hikita | H01L 29/7786 257/E29.089 |
| 2016/0071732 | A1* | 3/2016 | Nishii | H01L 21/02356 257/192 |
| 2016/0336437 | A1* | 11/2016 | Kajitani | H01L 29/7784 |
| 2019/0123187 | A1* | 4/2019 | Tarumi | H01L 29/808 |

OTHER PUBLICATIONS

Wei, J. Low On-Resistance Normally-Off GaN Double-Channel Metal-Oxide-Semiconductor High-Electron-Mobility Transistor IEEE Elec. Dev. Lett. Vol. 36, No. 12 Dec. 2015 pp. 1287-1290 (Year: 2015).*

Wang et al., "1100 V AlGaN/GaN MOSHEMTs With Integrated Tri-Anode Freewheeling Diodes", IEEE Electron Device Letters, Jul. 2018, pp. 1038-1041, vol. 39, No. 7, IEEE.

Reiner et al., "Integrated Reverse-Diodes for GaN-HEMT structures", Proceedings of the 27th International Symposium on Power Semiconductor Devices & IC's, May 10-14, 2015, pp. 45-48, IEEE.

Lei et al., "An Interdigitated GaN MIS-HEMT/SBD Normally-Off Power Switching Device with Low ON-resistance and Low Reverse Conduction Loss", 2017 IEEE International Electron Devices Meeting (IEDM), 2017, 4 pages, IEEE.

* cited by examiner

TRANSISTOR DEVICES AND METHODS OF FORMING A TRANSISTOR DEVICE

TECHNICAL FIELD

Various embodiments relate to transistor devices and methods of forming a transistor device, in particular, high electron mobility transistors for power switching applications.

BACKGROUND

High-electron mobility transistors (HEMTs) based on wide bandgap semiconductors are suitable for high-power electronics. For enhancement-mode HEMTs, the devices generally feature poor reverse conduction performance, as the reverse turn-on voltage is determined by the threshold voltage of the gate. Moreover, a negative gate voltage is usually applied to ensure a fail-safe operation. Under this situation, the reverse turn-on voltage is even larger, which results in more severe reverse conduction loss. For various power applications such as DC-AC inverter, it may be necessary for the HEMTs to have enhanced reverse conduction capability.

SUMMARY

According to various embodiments, there may be provided a transistor device. The transistor device may include a semiconductor structure having a trench formed therein. The semiconductor structure may include a buffer layer and a barrier layer arranged over the buffer layer. The trench may extend at least to the buffer layer. The transistor device may include a source terminal, a drain terminal, and a gate terminal arranged between the source terminal and the drain terminal. The gate terminal may extend into the trench. The transistor device may include an electrode component. The electrode component may include an electrode. The electrode component may extend into the trench where the electrode component is separated from the gate terminal. The electrode component may contact a side wall of the trench.

According to various embodiments, there may be provided a method of forming a transistor device. The method may include forming a trench in a semiconductor structure, forming a source terminal, forming a drain terminal, forming a gate terminal between the source terminal and the drain terminal, and forming an electrode component. The electrode component may include an electrode. The semiconductor structure may include a buffer layer and a barrier layer arranged over the buffer layer. The trench may extend at least to the buffer layer. The gate terminal may extend into the trench where the electrode component is separated from the gate terminal. The electrode component may extend into the trench. The electrode component may contact a side wall of the trench.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments are described with reference to the following drawings, in which.

DESCRIPTION

Embodiments described below in context of the devices are analogously valid for the respective methods, and vice versa. Furthermore, it will be understood that the embodiments described below may be combined, for example, a part of one embodiment may be combined with a part of another embodiment.

It will be understood that any property described herein for a specific device may also hold for any device described herein. It will be understood that any property described herein for a specific method may also hold for any method described herein. Furthermore, it will be understood that for any device or method described herein, not necessarily all the components or steps described must be enclosed in the device or method, but only some (but not all) components or steps may be enclosed.

It should be understood that the terms "on", "over", "top", "bottom", "down", "side", "back", "left", "right", "front", "lateral", "side", "up", "down" etc., when used in the following description are used for convenience and to aid understanding of relative positions or directions, and not intended to limit the orientation of any device, or structure or any part of any device or structure. In addition, the singular terms "a", "an", and "the" include plural references unless context clearly indicates otherwise. Similarly, the word "or" is intended to include "and" unless the context clearly indicates otherwise.

The term "coupled" (or "connected") herein may be understood as electrically coupled or as mechanically coupled, for example attached or fixed, or just in contact without any fixation, and it will be understood that both direct coupling or indirect coupling (in other words: coupling without direct contact) may be provided.

In order that the invention may be readily understood and put into practical effect, various embodiments will now be described by way of examples and not limitations, and with reference to the figures.

According to various embodiments, a transistor may include an integrated diode. The transistor may include a semiconductor structure, in which at least one trench is formed. The transistor may include an electrode component formed in the at least one trench. The electrode component may include an electrode. The electrode may serve as an anode of the diode, and may be connected to the source terminal of the transistor or may be an independent terminal. The cathode of the diode may be the drain terminal of the transistor.

According to various embodiments, the electrode component may further include a doped semiconductor member. The electrode may include a metal member adjacent to the doped semiconductor member.

Figure 1:
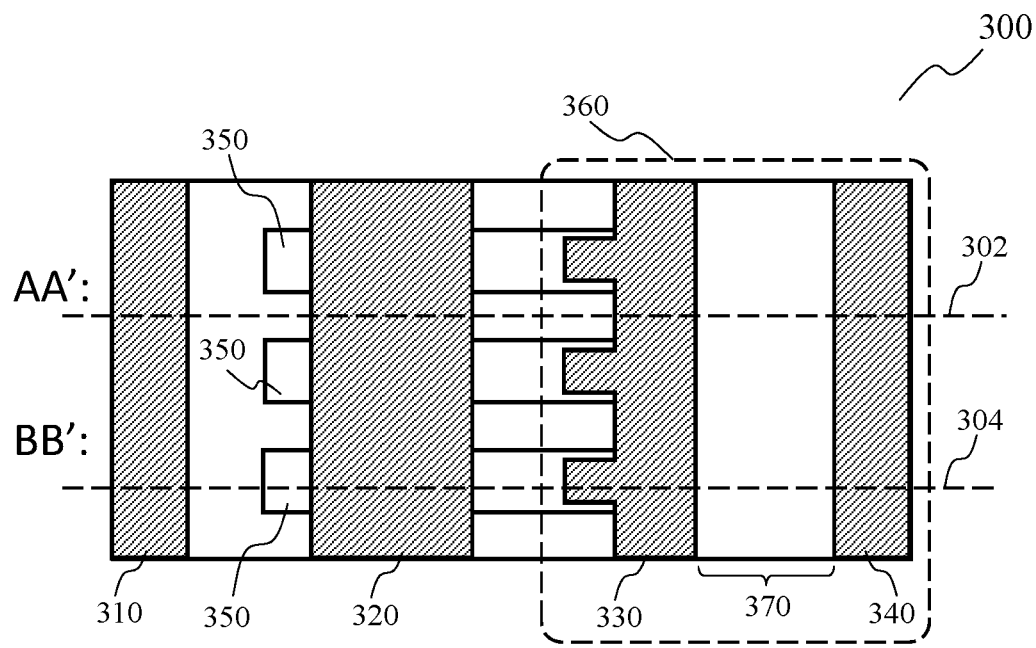
FIG. 1 shows a top schematic view of a transistor according to various embodiments.

FIG. 1 shows a top schematic view of a transistor 300 according to various embodiments. The transistor 300 may be a metal-insulator-semiconductor-high electron mobility transistor (MIS-HEMT). The transistor 300 may be a multi-gate transistor, for example, a tri-gate transistor. The transistor 300 may include gallium nitride (GaN) in one of the semiconductor layers. The transistor 300 may be a GaN MIS-HEMT. The transistor 300 may include a source terminal 310, a gate terminal 320 and a drain terminal 340. The gate terminal 320 may be arranged between the source terminal 310 and the drain terminal 340. The source terminal 310 and the drain terminal 340 may include an ohmic contact. The ohmic contact may include titanium, titanium nitride, aluminum, or combinations thereof. The transistor 300 may include a semiconductor structure, in which at least one trench 350 is formed. The gate terminal 320 may be formed over and into the trench 350. The gate terminal 320 may extend into the trench 350. The trench 350 may be partially underneath the gate terminal 320. The access region 370 of the transistor 300 may lie between the trench 350 and the drain terminal 340. The transistor 300 may include an integrated diode 360. The diode 360 may be an anti-paralleled diode. In other words, the cathode of the diode may connect to the drain terminal of a transistor, while the anode may connect to the source terminal. The diode 360 may include an electrode component 330. The electrode component 330 may include an electrode. The electrode component 330 may be formed at least partially in the trench 350. The electrode component 330 may be separated from the gate terminal 320 in the trench 350. The electrode component 330 may function as the anode of the diode 360. The electrode component 330 may be in contact with a side wall of the trench 350. The side wall may lie between the gate terminal 310 and the drain terminal 340. The drain terminal 340 may function as the cathode of the diode 360. The electrode component 330 may be electrically connected to the source terminal 310. The diode 360 may provide reverse conduction in the transistor 300, by restricting electrical current to flow from the electrode 330 to the cathode, in other words, in the direction of flowing from the source terminal 310 to the drain terminal 340. The diode 360 may be a Schottky barrier diode (SBD).

According to various embodiments, the electrode component 330 may include the electrode alone. Alternatively, the diode 360 may be a p-n diode, where the electrode component 330 further includes a doped semiconductor member that contacts the side wall of the trench. Said differently, 'electrode component' is defined herein to be any component that may include an electrode, e.g. a diode, or the electrode component may consist of an electrode.

FIG. 1 also shows a line AA' 302 that cuts across the transistor 300 along a region between two nearest trenches 350 and a line BB' 304 that cuts across the transistor 300 along one of the trenches 350.

Figure 2:
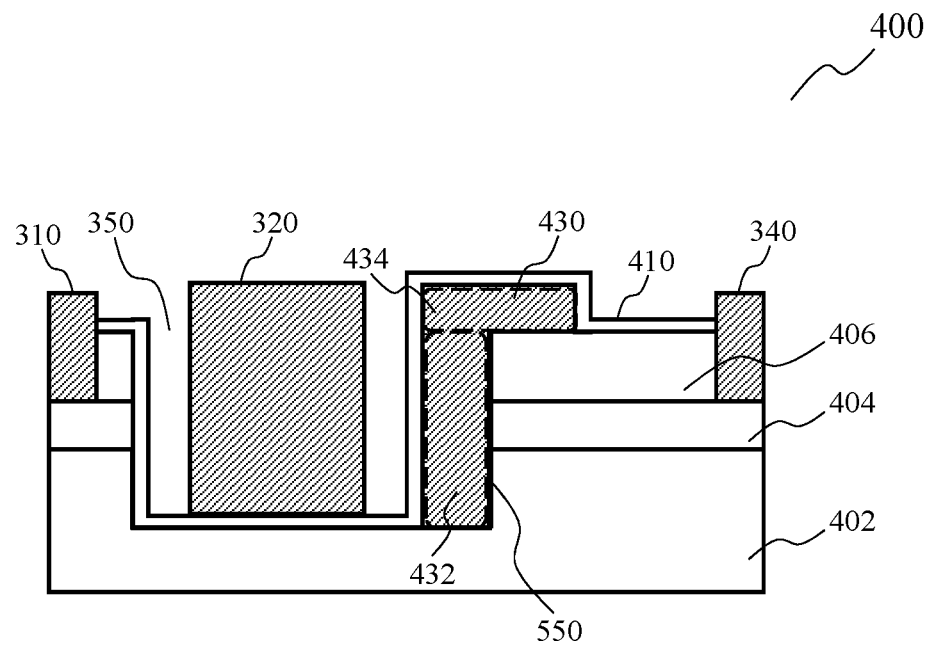
FIG. 2 shows a cross-sectional view of a transistor according to various embodiments, cut across the line BB'.

FIG. 2 shows a cross-sectional view of a transistor 400 according to various embodiments, cut across the line BB' 304 indicated in FIG. 1. The transistor 400 may be an embodiment of the transistor 300. The transistor 400 may include a buffer layer 402, a barrier layer 404 arranged over the buffer layer 402, and a passivation layer 406 arranged over the barrier layer 404. The buffer layer 102 may include GaN. The barrier layer 104 may include AlGaN, AlN, InAlN, GaN or combinations thereof. The barrier layer 104 may include, for example, $Al_{0.25}Ga_{0.75}N$. The passivation layer 406 may include a dielectric material, such as an oxide or a nitride, such as $Al_2O_3$, $SiO_2$, $SiN_x$ or combinations thereof. The transistor 400 may include a plurality of trenches 350. Each trench 350 may extend from the passivation layer 406 to the buffer layer 402. The trench 350 may reach partially within the buffer layer 402. The trench 350 may have an at least substantially vertical side wall 550. The side wall 550 may be at least substantially planar. The transistor 400 may include a SBD diode. The SBD diode may include an electrode component. The electrode component may include an electrode 430. The electrode 430 may be an anode of the SBD diode. The electrode 430 may include nickel, gold, nickel/gold alloy, titanium, titanium nitride, or combinations thereof.

The electrode 430 may include a plurality of vertical components 432 and a horizontal component 434. Each vertical component 432 may contact the side wall 550 of a respective trench 350. The horizontal component 434 may partially overlap the upper surface 552 of the passivation layer 406. The plurality of vertical components 432 and the horizontal component 434 of the electrode 430 may be integrally formed. The quantity of the vertical components 432 may correspond to the quantity of trenches 350 in the semiconductor structure. The transistor 400 may include a dielectric layer 410. The dielectric layer 410 may include a dielectric material, for example, $Al_2O_3$, $SiO_2$, $SiN_x$ or combinations thereof. The dielectric layer 410 may be identical in material composition, as the passivation layer 406. The dielectric layer 410 may also be interchangeably referred herein as the gate dielectric layer.

The dielectric layer 410 may be at least partially arranged over the passivation layer 406. The dielectric layer 410 may at least partially line the trenches 350, and may be arranged under at least a portion of the gate terminal 320, or underneath the entire gate terminal 320. The dielectric layer 410 may overlap surfaces of the electrode 430 that are not in contact with the side wall 550 and the passivation layer 406. The dielectric layer 410 may at least partially enclose surfaces of the electrode 430 that are not in direct contact with any one of the buffer layer 402, the barrier layer 404, and the passivation layer 406.

FIGS. 5A to 5B show a method of forming the diode anode of the transistor 400 according to various embodiments, illustrated through cross-sectional views across the line BB' 304 indicated in FIG. 1.

Figure 3A:
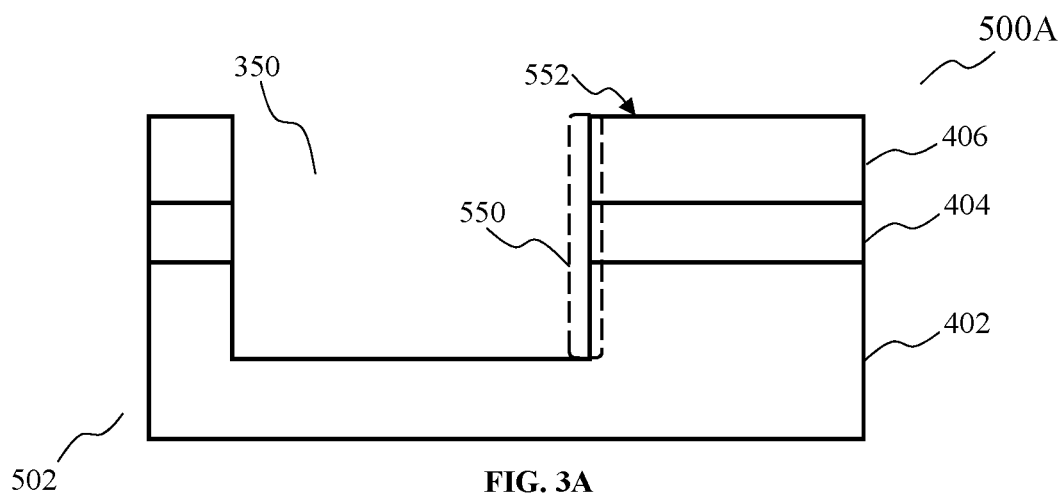
FIGS. 3A to 3B show a method of forming the diode anode of the transistor of FIG. 2 according to various embodiments, illustrated through cross-sectional views across the line BB'.

FIG. 3A shows a process 500A according to various embodiments. The process 500A may include providing a base structure 502. The base structure 502 may also be referred herein as a semiconductor structure. The base structure 502 may include an epitaxial structure grown on a substrate (not shown). The base structure 502 may include a buffer layer 402, a barrier layer 404 arranged over the buffer layer 402, and a passivation layer 406 arranged over the barrier layer 404. The base structure 502 may include a plurality of trenches 350 formed therein, for example, by etching. Each trench 350 may extend from the passivation layer 406 to partially within the buffer layer 402. The trench 350 may have an at least substantially vertical side wall 550.

Figure 3B:
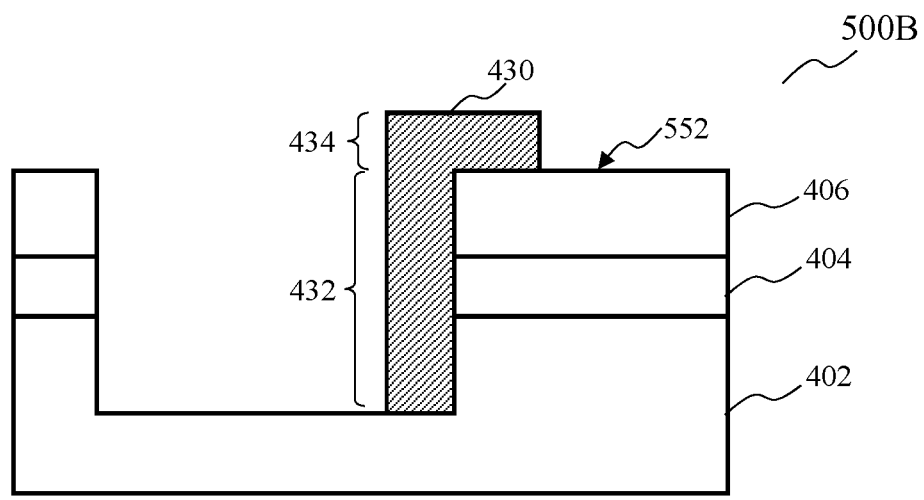

FIG. 3B shows a process 500B according to various embodiments. The process 500B may include forming the electrode 430. Forming the electrode 430 may include depositing a metallic material into the trench 350. The metallic material may be patterned to form the electrode 430. Part of the deposited metallic material may be removed so that the metallic material does not fill up the trench 350 entirely. An empty space may be formed in the trench 350, adjacent to a first side of the electrode 430. A second side of the electrode 430, opposite to the first side, may be adjacent to the side wall 550. The electrode 430 may extend beyond the trench 350, to partially overlap an upper surface 552 of the passivation layer 406.

Figure 4:
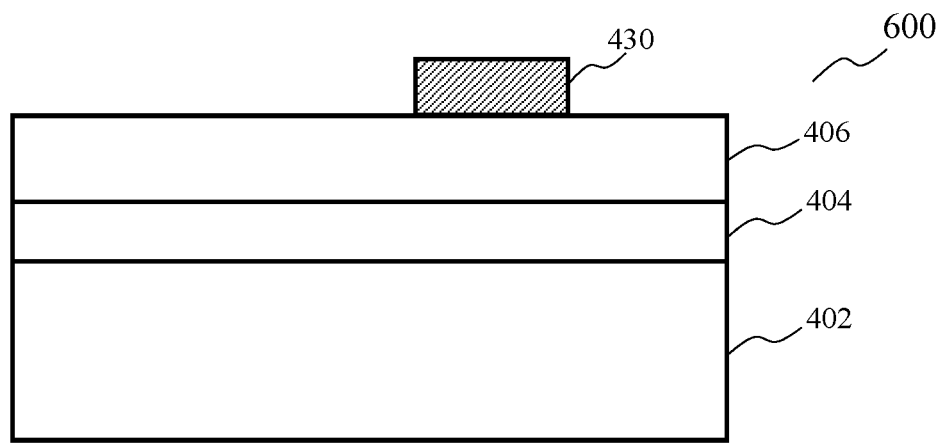
FIG. 4 shows a cross-sectional view across the line AA' of the same device as shown in FIG. 3B.

FIG. 4 shows a cross-sectional view 600 across the line AA' 302 of the same device as shown in FIG. 3B, i.e. the device resulting from the process 500B. The horizontal component 430 of the electrode 430 may be above and in contact with the passivation layer 406. The horizontal component 430 may span above the plurality of trenches 350, to connect a corresponding plurality of vertical components 432 of the electrode 430.

Figure 5:
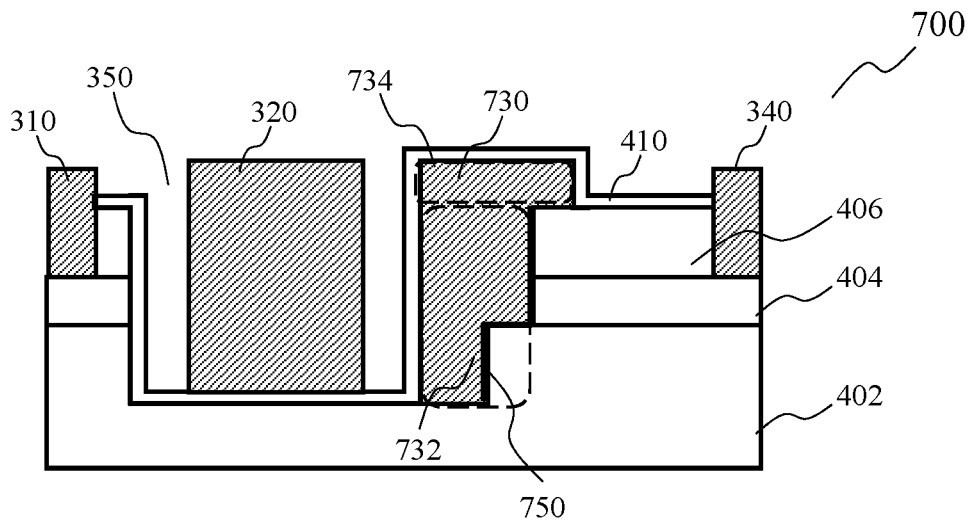
FIG. 5 shows a cross-sectional view of a transistor according to various embodiments, cut across the line BB'.

FIG. 5 shows a cross-sectional view of a transistor 700 according to various embodiments, cut across the line BB' 304. The transistor 700 may be an embodiment of the transistor 300. The transistor 700 may be similar to the transistor 400, but in the transistor 700, the barrier layer 404 and the passivation layer 406 may be recessed relative to the buffer layer 402. In other words, the buffer layer 402 may protrude into the trench 350 as compared to the barrier layer 404 and the passivation layer 406. As a result, the side wall 750 of the trench 350 in the transistor 700 may have a stepped structure instead of being at least substantially planar. According to various embodiments, a portion of the buffer layer or a portion of the barrier layer 404 may also protrude into the trench from the side wall, relative to the passivation layer. The transistor 700 may include a SBD diode where the electrode component includes an electrode 730. The electrode 730 may be an anode of the SBD diode. The electrode 730 may include a vertical component 732 and a horizontal component 734. The vertical component 732 and the horizontal component 734 may be integrally formed. The electrode 730 may be formed against the stepped side wall 750. In other words, the electrode 730, in particular, the vertical component 732, may conform to the stepped structure of the side wall 750. Consequently, the electrode 730 may be in direct contact with a portion of the buffer layer 402 that protrudes into the trench from underneath the barrier layer 404. The channel at the access region 370, also referred herein as the access region channel, may be at the interface between the buffer layer 402 and the barrier layer 404. The two-dimensional electron gas may be about 5 to 6 nm thick at the interface between the buffer layer 402 and the barrier layer 404. The stepped structure of the side wall 750 may provide a larger surface area of contact between the electrode 730 and the access region channel. The electrode 730 may function as a field plate deployed on the passivation layer 406, which may suppress the electric field at the contact point between the electrode 730 and the access region channel, such that the OFF-state reverse leakage of current across the electrode 730 is reduced.

FIGS. 8A to 8B show a method of forming the diode anode of transistor 700 according to various embodiments, illustrated through cross-sectional views across the line BB'.

Figure 6A:
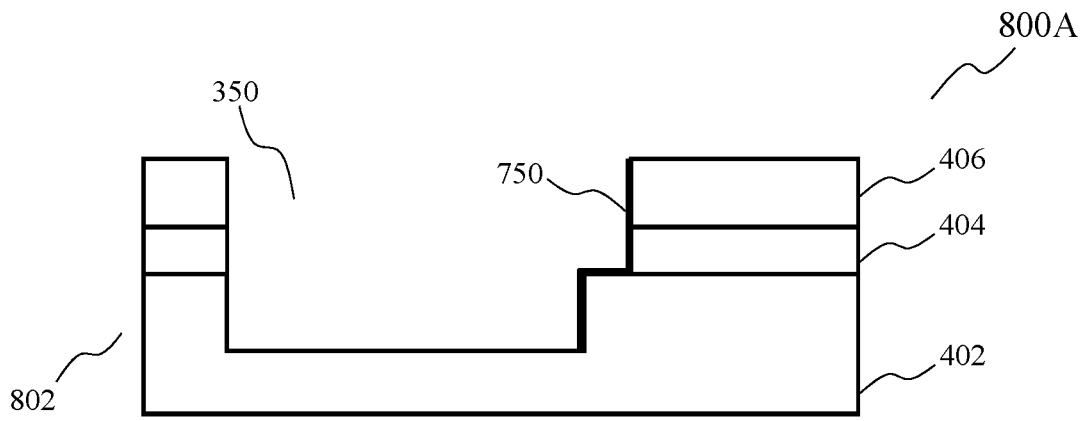
FIGS. 6A to 6B show a method of forming the diode anode of the transistor of FIG. 5 according to various embodiments, illustrated through cross-sectional views across the line BB'.

FIG. 6A shows a process 800A according to various embodiments. The process 800A may include providing a base structure 802. In the base structure 802, the barrier layer 404 may be recessed at the side wall 750 of the trench 350. In other words, a portion of the buffer layer 402 under the barrier layer 404 may protrude into the trench from a sidewall of the barrier layer 404. One side of the trench 350 that is closer to the drain terminal 340 than the source terminal 310, i.e. at the side wall 750, may have a stepped profile. The passivation layer 406 may also be recessed from the side wall 750. The passivation layer 406 may be aligned with the barrier layer 404. The trench 350 may be narrower at a bottom portion within the buffer layer 402, and may be wider above the bottom portion. The process 800A may include removing part of the barrier layer 404 and part of the passivation layer 406 of the base structure 502 (shown in FIG. 3A), to create the stepped profile. The process 800A may include the process 500A, and may further include etching the barrier layer 404 and the passivation layer 406 of the base structure 502.

Figure 6B:
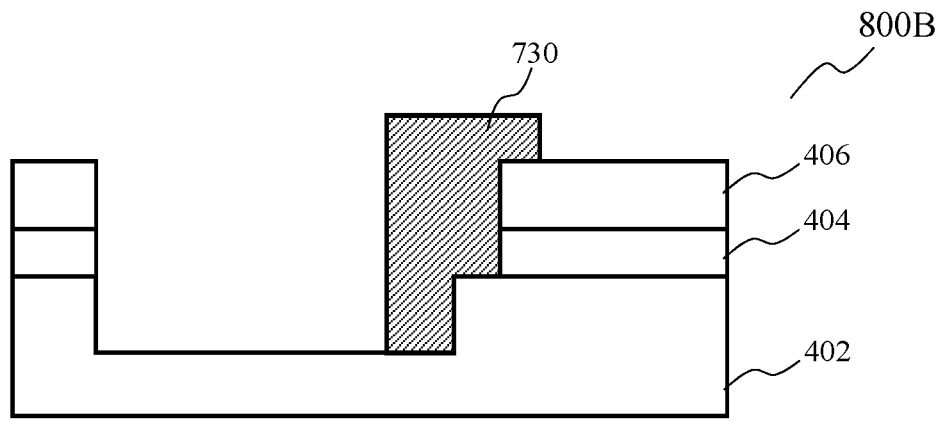

FIG. 6B shows a process 800B in a method of forming the transistor 700 according to various embodiments, illustrated through a cross-sectional view across the line BB' 304 indicated in FIG. 1. The process 800B may include forming the electrode 730. Forming the electrode 730 may include depositing a metallic material into the trench 350, and then patterning the deposited metallic material. The process 800B may be identical to the process 500B.

Figure 7A:
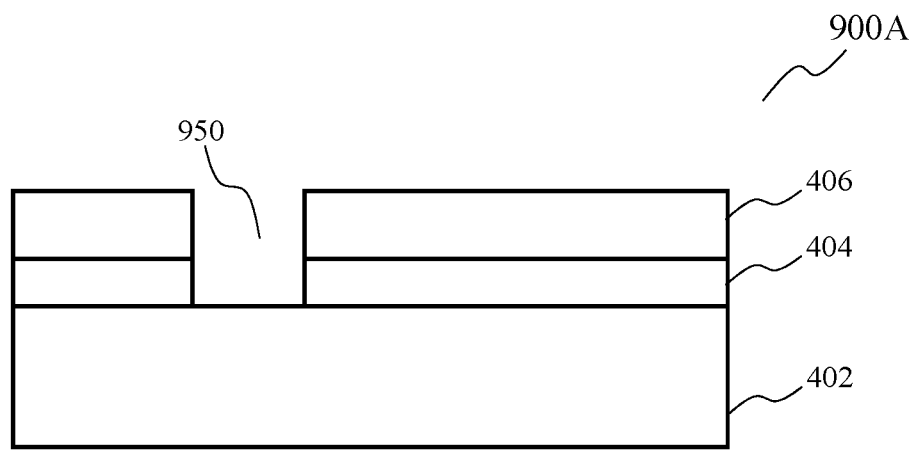
FIG. 7A shows a cross-sectional view across the line AA' of the same device as shown in FIG. 6A.

FIG. 7A shows a cross-sectional view 900A across the line AA' 302 of the same device as shown in FIG. 6A, i.e. the device resulting from the process 800A. The cross-sectional view 900A shows that the process 900A may include forming a cavity 950 that reaches the buffer layer 402. The cavity 950 may lie under the gate terminal 320 when the gate terminal 320 is subsequently formed. Forming the cavity 950 may include etching the barrier layer 404 under the gate terminal 320, to form an enhancement mode device.

Figure 7B:
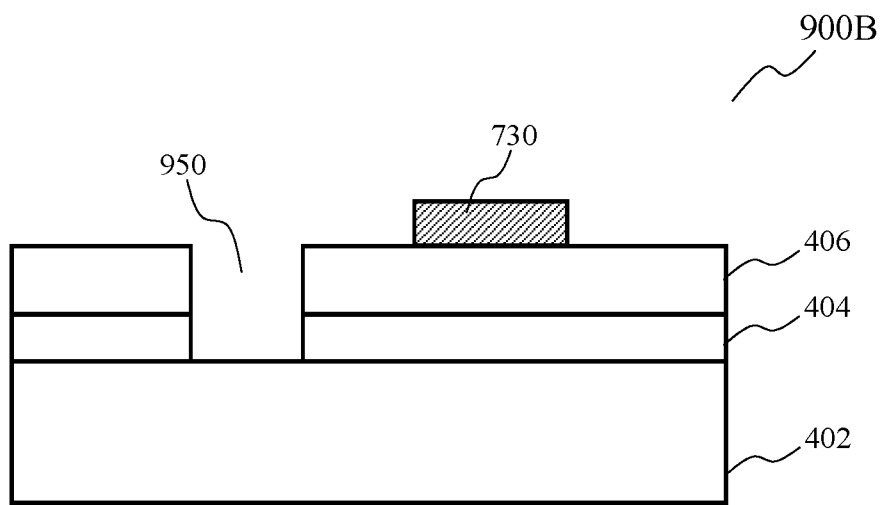
FIG. 7B shows a cross-sectional view across the line AA' of the same device as shown in FIG. 6B.

FIG. 7B shows a cross-sectional view 900B across the line AA' 302 of the same device as shown in FIG. 6B, i.e. the device resulting from the process 800B. The cross-sectional view 900B show that the electrode 730 is formed after the cavity 950 is formed.

Figure 8:
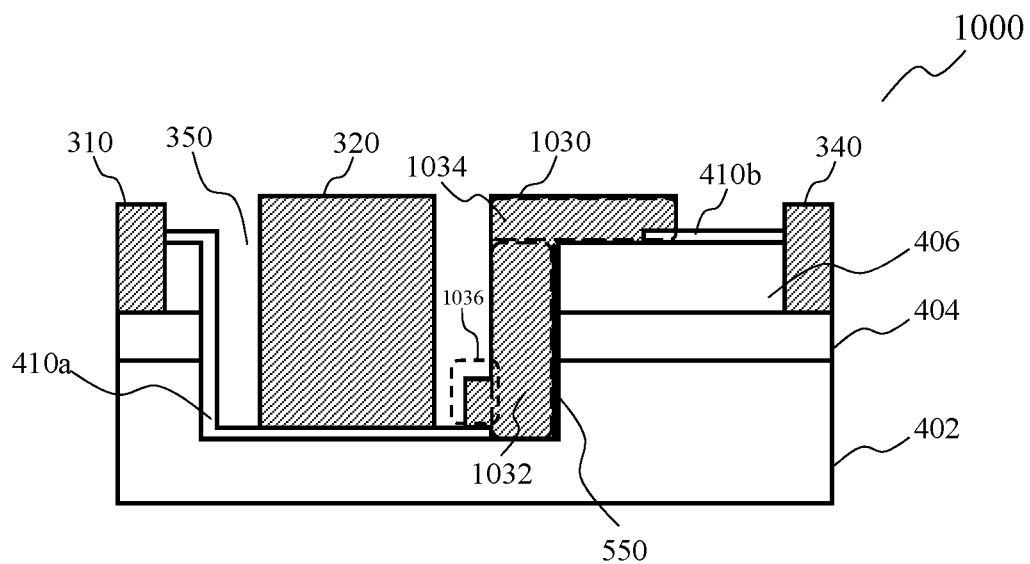
FIG. 8 shows a cross-sectional view of a transistor according to various embodiments, cut across the line BB'.

FIG. 8 shows a cross-sectional view of a transistor 1000 according to various embodiments, cut across the line BB' 304. The transistor 1000 may be an embodiment of the transistor 300. Like in the transistor 400, the transistor 1000 may include a plurality of trenches 350. The trench 350 may have an at least substantially vertical side wall 550. The transistor 1000 may include a SBD diode where the electrode component includes an electrode 1030. The electrode 1030 may be an anode of the SBD diode. The transistor 1000 may be similar to the transistor 400, but in the transistor 1000, the electrode 1030 may not be covered by a first dielectric layer 410a. The electrode 1030 may include a vertical component 1032 and a horizontal component 1034. The electrode 1030 may further include a protrusion 1036 at a bottom region of the vertical component 1032 that extends away from the side wall 550. The first dielectric region 410a may extend from the source terminal 310, down into the trench 350 and under the gate terminal 320, and terminate under the protrusion 1036 of the electrode 1030. There may be a second dielectric region 410b of the passivation layer 410 over the passivation layer 406 that partially covers the passivation layer 406. The second dielectric region 410b may be partially under the horizontal component 1034 of the electrode 1030.

FIGS. 11A to 11B show a method of forming the diode anode of the transistor 1000 according to various embodiments, illustrated through cross-sectional views across the line BB'.

Figure 9A:
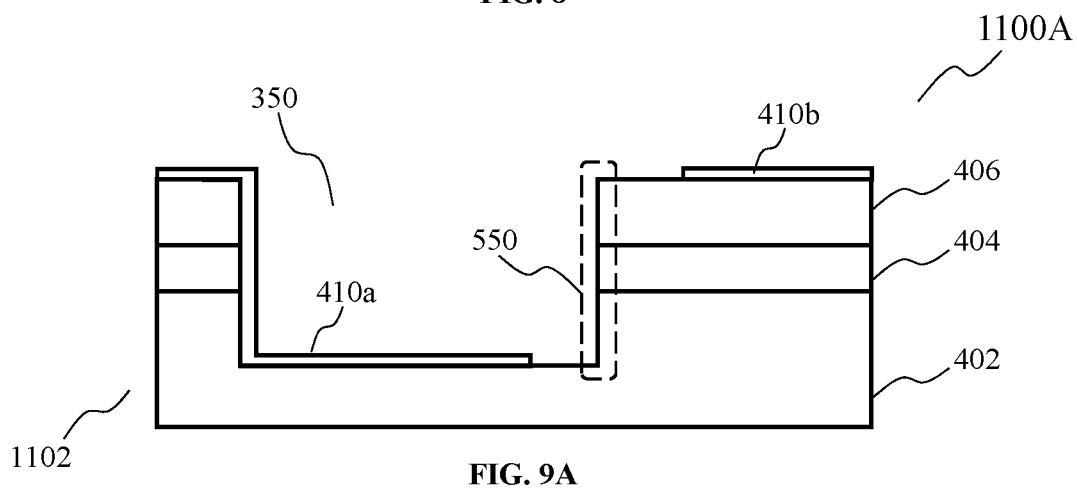
FIGS. 9A to 9B show a method of forming the diode anode of the transistor of FIG. 8 according to various embodiments, illustrated through cross-sectional views across the line BB'.

FIG. 9A shows a process 1100A according to various embodiments. The process 1100A may include providing a base structure 1102. The base structure 1102 may be similar to the base structure 502 in that it may include the buffer layer 402, the barrier layer 404 arranged over the buffer layer 402, and the passivation layer 406 arranged over the barrier layer 404. The base structure 1102 may include a plurality of trenches 350. Each trench 350 may have an at least substantially vertical side wall 550. The process 1100A may include depositing a dielectric material over the passivation layer 406 and into the trenches 350. The process 1100A may further include etching the deposited dielectric material to form the first dielectric region 410a and the second dielectric region 410b.

Figure 9B:
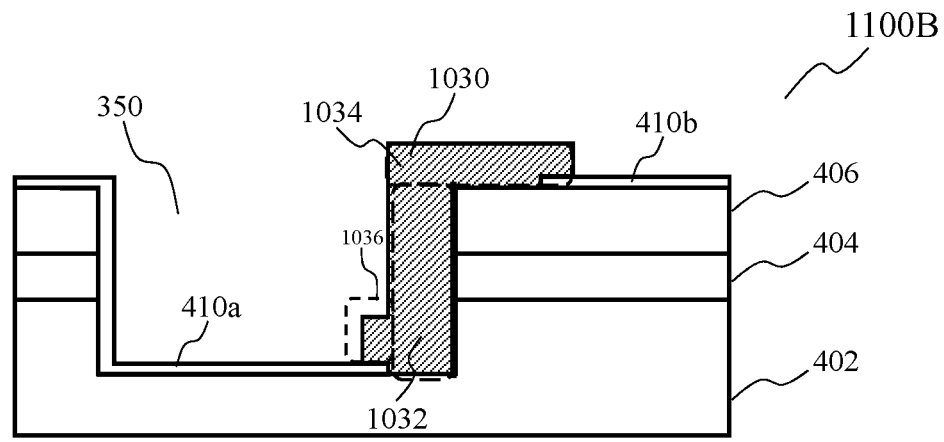
Figure 10A:
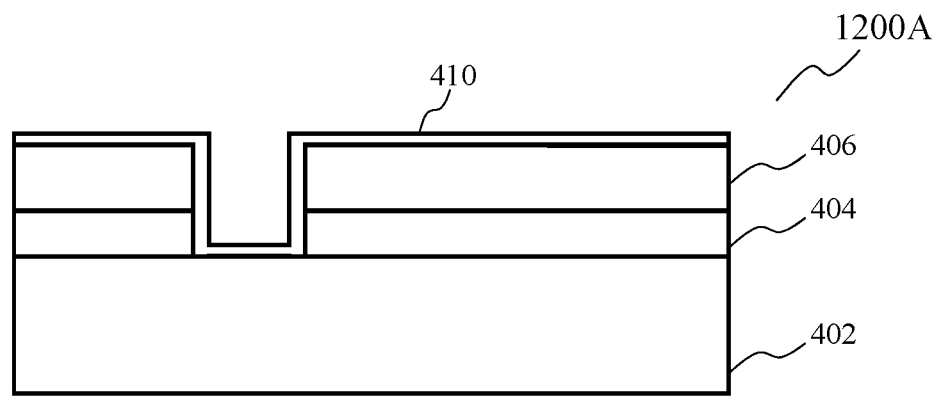
FIG. 10A shows a cross-sectional view across the line AA' of the same device as shown in FIG. 9A.

FIG. 9B shows a process 1100B according to various embodiments. The process 1100B may include forming the electrode 1030. Forming the electrode 1030 may include depositing a metallic material into the trench 350, and then patterning the deposited metallic material. The process 1100B may be identical to the process 500B. The protrusion 1036 may be formed at the same time with the vertical component 1032 and the horizontal component 1034. The electrode 1030 may be formed under layout design FIG. 10A shows a cross-sectional view 1200A across the line AA' 302 of the same device as shown in FIG. 9A, i.e. the device resulting from the process 1100A. The cross-sectional view 1200A show that the process 1100A may include forming a cavity 950 that reaches the buffer layer 402, like in the process 800A. The cavity 950 may lie under the gate terminal 320 when the gate terminal 320 is subsequently formed. Compared to the process 800A, the process 1100A may further include forming the dielectric layer 410 over the passivation layer 406. The dielectric layer 410 may reach into the cavity 950 to overlap inner surfaces of the cavity 950. The dielectric layer 410 may be continuous across a width of the device, from under the source terminal 310 to under the drain terminal 340, along the line AA' 302 between the trenches 350.

Figure 10B:
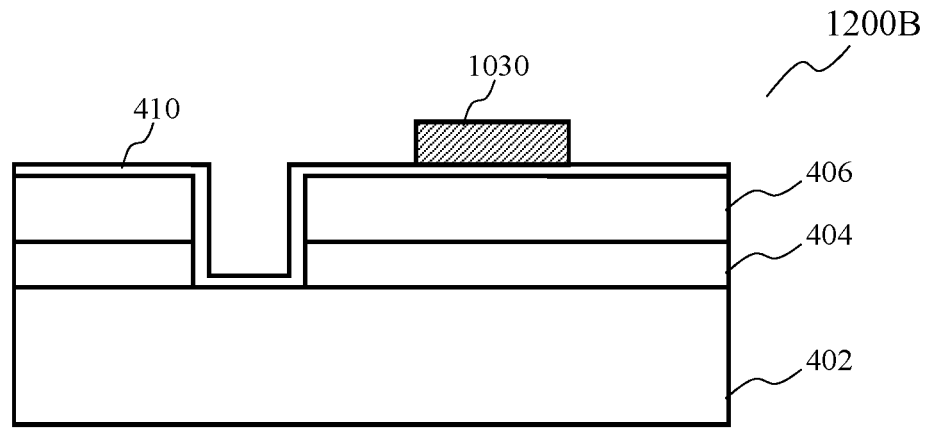
FIG. 10B shows a cross-sectional view across the line AA' of the same device as shown in FIG. 9B.

FIG. 10B shows a cross-sectional view 1200B across the line AA' 302 of the same device as shown in FIG. 9B, i.e. the device resulting from the process 1100B. The cross-sectional view 1200B show that the electrode 1030 is formed after the cavity 950 and the dielectric layer 410 are formed. The electrode 1030 may be formed over the dielectric layer 410 along regions of the dielectric layer that lie between the trenches 350.

Figure 11:
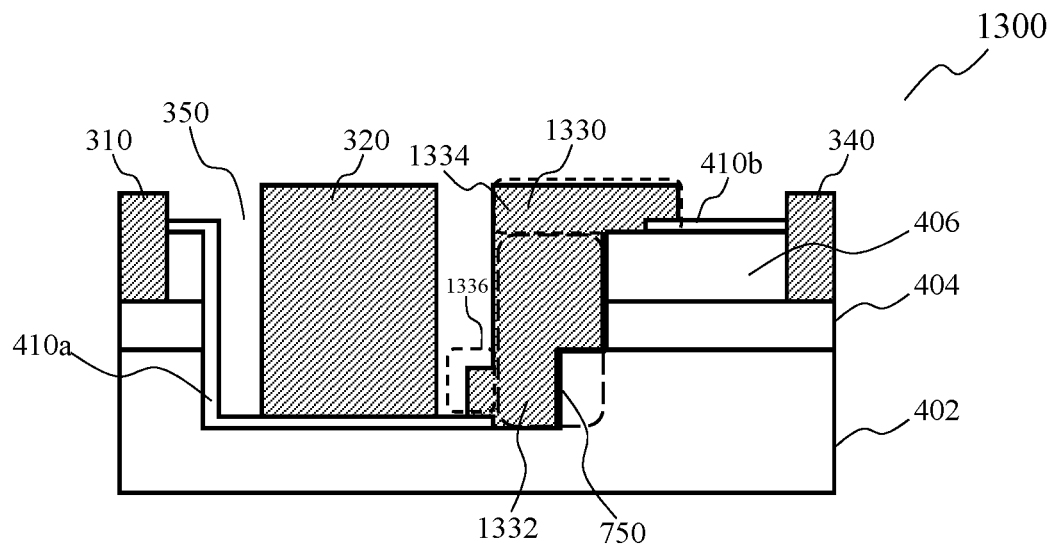
FIG. 11 shows a cross-sectional view of a transistor according to various embodiments, cut across the line BB'.
Figure 12A:
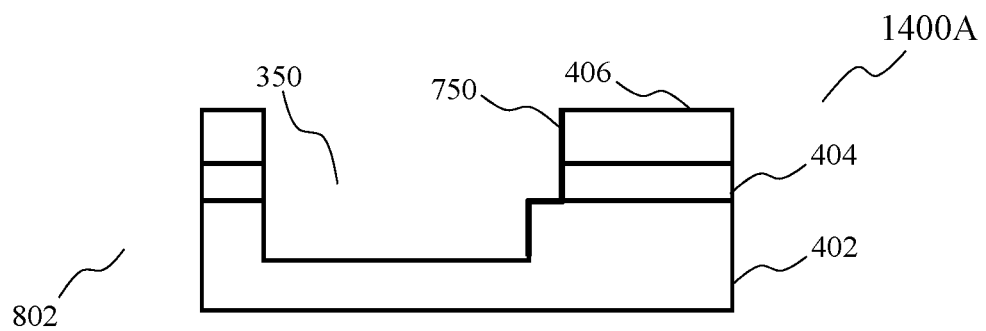
FIGS. 12A to 12D show a method of forming the transistor of FIG. 11 according to various embodiments, illustrated through cross-sectional views across the line BB'.
Figure 12B:
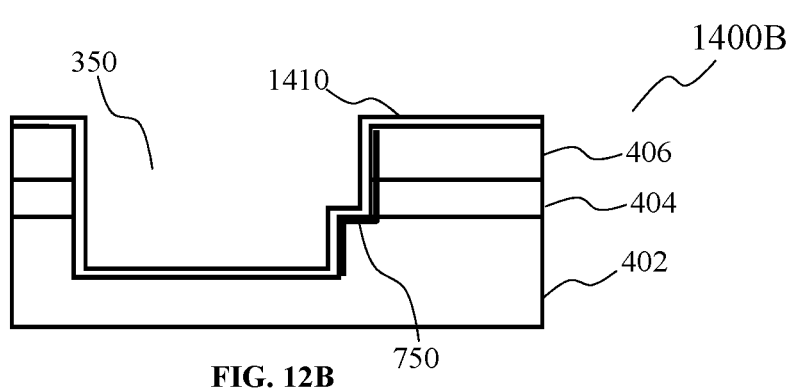
Figure 12C:
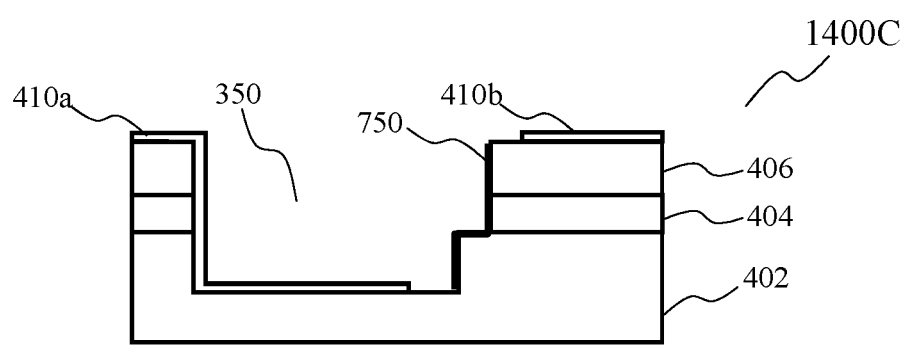
Figure 12D:
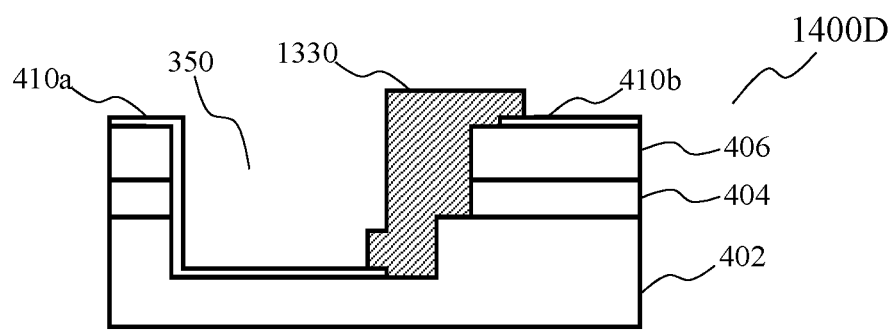

FIG. 11 shows a cross-sectional view of a transistor 1300 according to various embodiments, cut across the line BB' 304. The transistor 1300 may be an embodiment of the transistor 300. Like in the transistor 700, the trenches 350 of the transistor 1300 may have a side wall 750 that has a stepped structure. The transistor 1300 may include a SBD diode. The SBD diode may include an electrode component that has an electrode 1330. The electrode 1330 may be the anode of the SBD diode. The electrode 1330 may be formed against the stepped side wall 750. The electrode 1330 may be in direct contact with a portion of the buffer layer 402 that protrudes out under the barrier layer 404. The access region channel at the interface between the buffer layer 402 and the barrier layer 404 may be at least partially in direct contact with the electrode 1330. The electrode 1330 may function as a field plate that suppresses the electric field at the contact point between the electrode 1330 and the access region channel, such that the OFF-state leakage current across the diode is reduced. The electrode 1330 may include a vertical component 1332 and a horizontal component 1334. The electrode 1330 may further include a protrusion 1336 at a bottom region of the vertical component 1332. The protrusion 1336 may extend in a direction away from the side wall 750. The vertical component 1332, the horizontal component 1334 and the protrusion 1336 may be integrally formed. The dielectric layer 410 may include a first dielectric region 410a and a second dielectric region 410b. The first gate dielectric region 410a may extend from the source terminal 310, down into the trench 350 and under the gate terminal 320, and terminate under the protrusion 1336 of the electrode 1030. The second dielectric region 410b of the dielectric layer 410 may partially cover the passivation layer 406. The second dielectric region 410b may be partially under the horizontal component 1034 of the electrode 1030. The horizontal component 1334 may partially overlay the passivation layer 406 and the second dielectric region 410b.

FIGS. 14A to 14D show a method of forming the transistor 1300 according to various embodiments, illustrated through cross-sectional views across the line BB' 304.

FIG. 14A shows a process 1400A according to various embodiments. The process 1400A may include providing a base structure 802. The process 1400A may include the process 800A.

FIG. 14B shows a process 1400B according to various embodiments. The process 1400B may include depositing a dielectric material 1410 over the base structure 802 to form a dielectric layer 410. The dielectric material 1410 may coat an upper surface of the passivation layer 406, and also coat the inner surfaces of the trench 350, including the side wall 750.

FIG. 14C shows a process 1400C according to various embodiments. The process 1400C may include removing part of the deposited dielectric material 1410, for example, by etching, to form dielectric region 410a and 410b. The dielectric material 1410 in contact with the side wall 750 may be removed. A section of the dielectric material 1410 adjoining the side wall 750 and in contact with the buffer layer 402 within the trench 350 may also be removed. The resulting dielectric layer 410 may include a first dielectric region 410a and a second dielectric region 410b. The first dielectric region 410a may line a first side wall of the trench 350 that opposes the side wall 750. The first dielectric region 410a may overlap an upper surface of the passivation layer 406 that lies adjacent to the first side wall of the trench 350. The first dielectric region 410a may also partially overlap an upper surface of the buffer layer 402, within the trench 350. The second dielectric region 410b may partially overlap the upper surface of the passivation layer that lies adjacent to the side wall 750.

FIG. 14D shows a process 1400D according to various embodiments. The process 1400D may include forming the electrode 1330. The process 1400D may include the process 1100B.

Figure 13A:
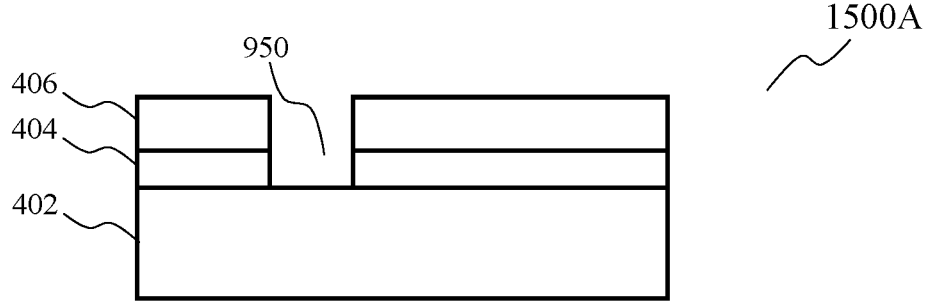
FIG. 13A shows a cross-sectional view across the line AA' of the same device as shown in FIG. 12A.

FIG. 13A shows a cross-sectional view 1500A across the line AA' 302 of the same device as shown in FIG. 14A, i.e. the device resulting from the process 1400A.

Figure 13B:
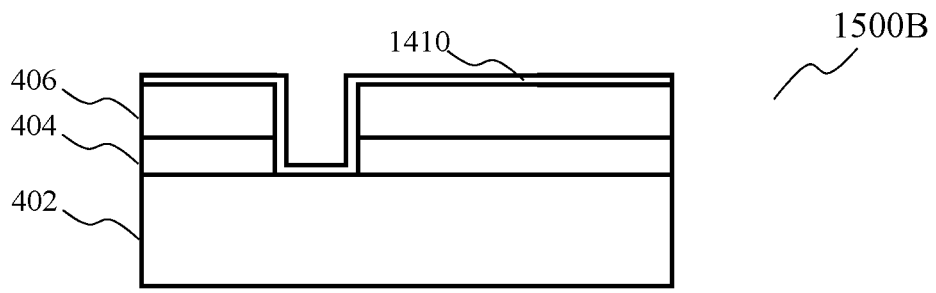
FIG. 13B shows a cross-sectional view across the line AA' of the same device as shown in FIG. 12B.

FIG. 13B shows a cross-sectional view 1500B across the line AA' 302 of the same device as shown in FIG. 14B, i.e. the device resulting from the process 1400B.

Figure 13C:
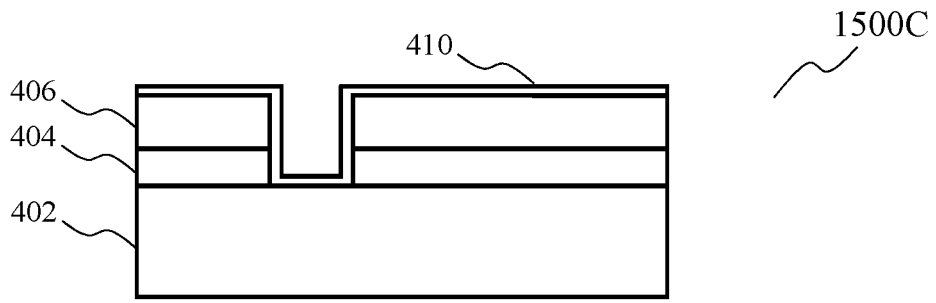
FIG. 13C shows a cross-sectional view across the line AA' of the same device as shown in FIG. 12C.

FIG. 13C shows a cross-sectional view 1500C across the line AA' 302 of the same device as shown in FIG. 14C, i.e. the device resulting from the process 1400C. The cross-sectional view 1500C may appear to be identical to the cross-sectional view 1500B, indicating that the process 1400C partially removes the passivation material 1410 only from within the trenches 350.

Figure 13D:
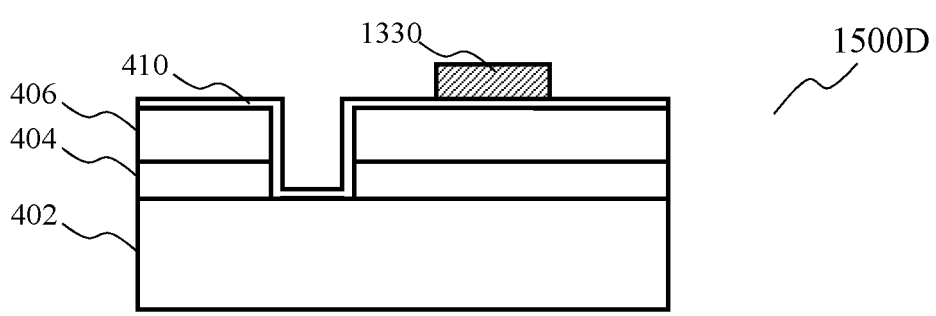
FIG. 13D shows a cross-sectional view across the line AA' of the same device as shown in FIG. 12D.

FIG. 13D shows a cross-sectional view 1500D across the line AA' 302 of the same device as shown in FIG. 14D, i.e. the device resulting from the process 1400D.

Figure 14:
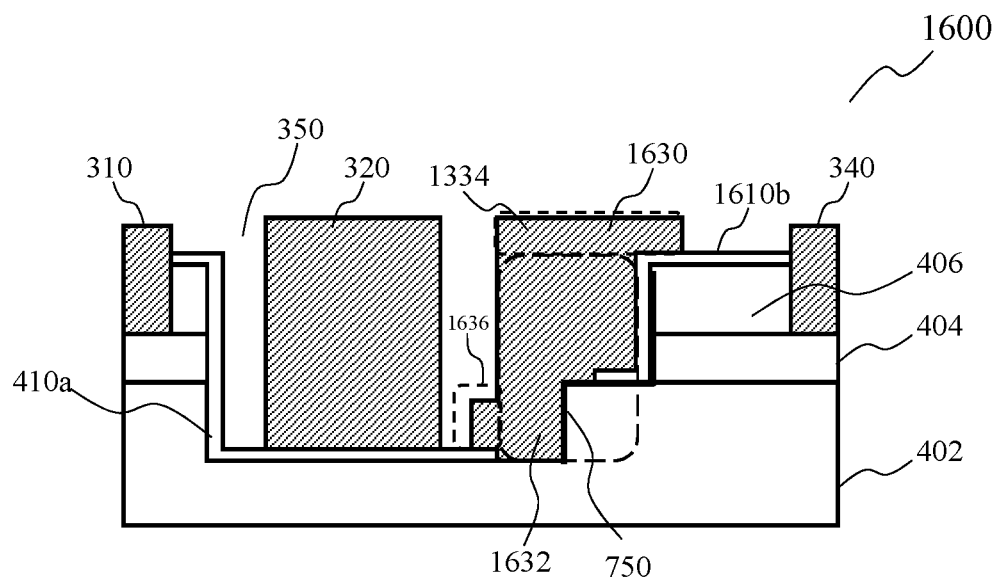
FIG. 14 shows a cross-sectional view of a transistor according to various embodiments, cut across the line BB'.

FIG. 14 shows a cross-sectional view of a transistor 1600 according to various embodiments, cut across the line BB' 304. The transistor 1600 may be an embodiment of the transistor 300. Like in the transistor 1300, the trenches 350 of the transistor 1600 may have a side wall 750 that has a stepped structure. The transistor 1600 may include a SBD diode where the electrode component has an electrode 1630. The electrode 1630 may be the anode of the SBD diode. The electrode 1630 may be in direct contact with a portion of the buffer layer 402 that protrudes out under the barrier layer 404. The electrode 1630 may be at least partially in direct contact with the access region channel at the interface between the buffer layer 402 and the barrier layer 404. The electrode 1630 may function as a field plate that suppresses the electric field at the contact point between the electrode 1630 and the access region channel, such that OFF-state leakage current of the diode is reduced. The electrode 1630 may include a vertical component 1632 and a horizontal component 1634. The electrode 1630 may further include a protrusion 1636 at a bottom region of the vertical component 1632. The protrusion 1636 may extend in a direction away from the side wall 750. The vertical component 1632, the horizontal component 1634 and the protrusion 1636 may be integrally formed. The transistor 1600 may include a dielectric layer 410 that may include a first dielectric region 410a and a second dielectric region 1610b. The transistor 1600 may differ from the transistor 1300 in that the second dielectric region 1610b may line part of the side wall 750, adjacent to the passivation layer 406 and the barrier layer 404. The second dielectric region 1610b may also partially overlap the access region channel at the interface between the buffer layer 402 and the barrier layer 404. The second dielectric region 1610b in the transistor 1600 may be partially disposed between the electrode 1630 and the side wall 750.

FIGS. 17A to 17D show a method of forming the transistor 1600 according to various embodiments, illustrated through cross-sectional views across the line BB' 304.

Figure 15A:
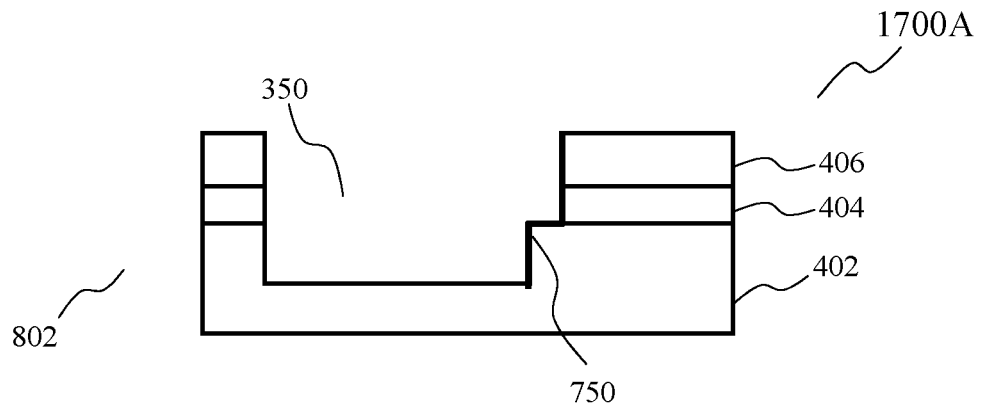
FIGS. 15A to 15D show a method of forming the transistor of FIG. 14 according to various embodiments, illustrated through cross-sectional views across the line BB'.

FIG. 15A shows a process 1700A according to various embodiments. The process 1700A may include providing a base structure 802. The process 1700A may include the process 800A.

Figure 15B:
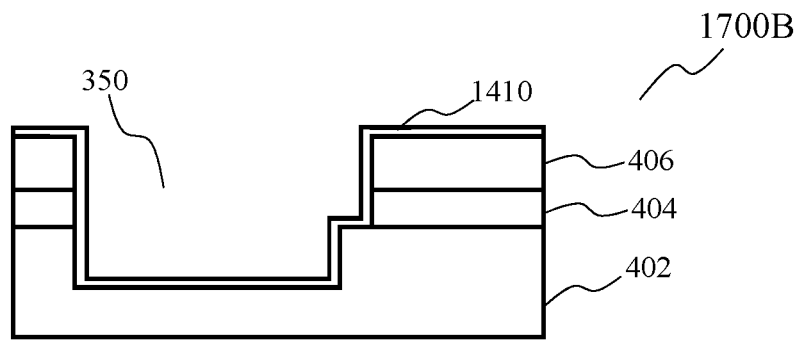

FIG. 15B shows a process 1700B according to various embodiments. The process 1700B may include the process 1400B.

Figure 15C:
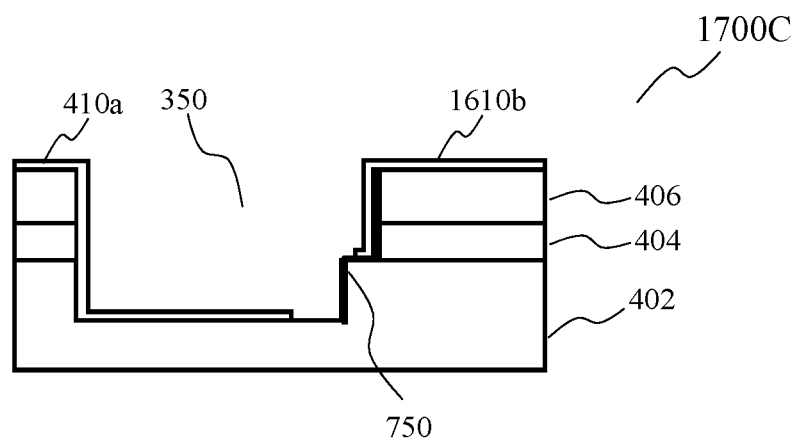

FIG. 15C shows a process 1700C according to various embodiments. The process 1700C may include removing part of the deposited dielectric material 1410, for example, by etching, to form a dielectric layer 410. A section of the dielectric material 1410 adjoining the side wall 750 and in contact with the buffer layer 402 within the trench 350 may be removed. A section of the passivation material 1410 that is in contact with a portion of the side wall 750 adjacent to the buffer layer 402 may also be removed. A section of the dielectric material 1410 in contact with part of the access region channel may also be removed. The resulting dielectric layer 410 may include the first dielectric region 410a and the second dielectric region 1610b. The first dielectric region 410a may line a first side wall of the trench 350 that opposes the side wall 750. The first dielectric region 410a may overlap an upper surface of the passivation layer 406 that lies adjacent to the first side wall of the trench 350. The first dielectric region 410a may also partially overlap an upper surface of the buffer layer 402, within the trench 350. The second dielectric region 410a may partially overlap the upper surface of the passivation layer 406 and may extend into the trench 350 to contact a portion of the side wall 750 that lies adjacent to the passivation layer 406 and the barrier layer 404.

Figure 15D:
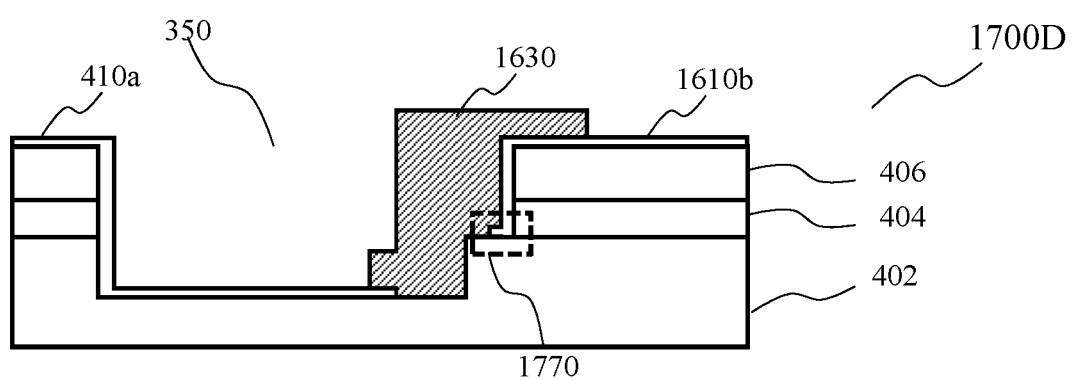

FIG. 15D shows a process 1700D according to various embodiments. The process 1700D may include forming the electrode 1630. The process 1700D may include the process 1100B. The electrode 1630, the second dielectric region 1610b and the buffer 402 may form a metal-oxide(insulator)-semiconductor (MOS or MIS) structure 1770.

Figure 16A:
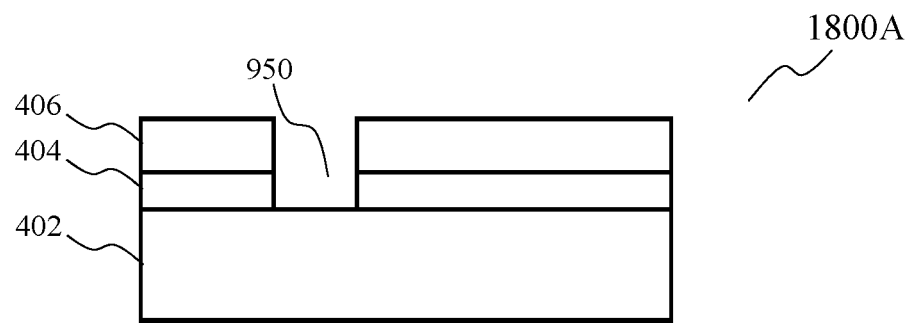
FIG. 16A shows a cross-sectional view across the line AA' of the same device as shown in FIG. 15A.

FIG. 16A shows a cross-sectional view 1800A across the line AA' 302 of the same device as shown in FIG. 15A, i.e. the device resulting from the process 1700A.

Figure 16B:
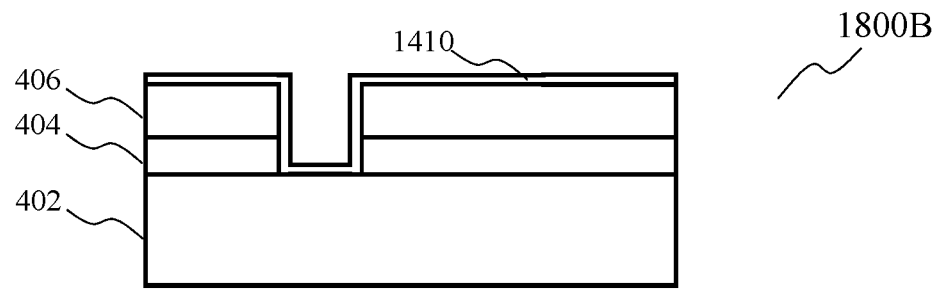
FIG. 16B shows a cross-sectional view across the line AA' of the same device as shown in FIG. 15B.

FIG. 16B shows a cross-sectional view 1800B across the line AA' 302 of the same device as shown in FIG. 15B, i.e. the device resulting from the process 1700B.

Figure 16C:
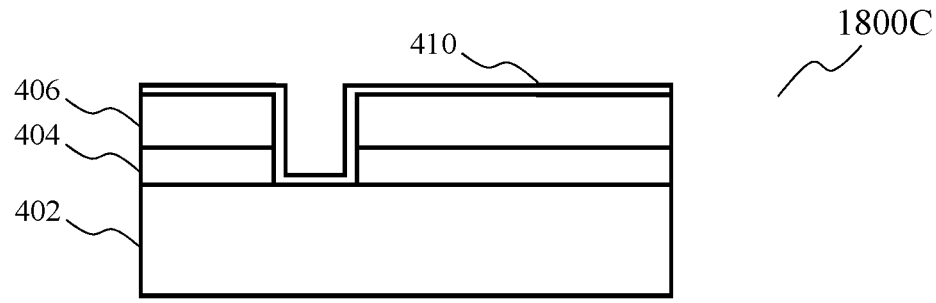
FIG. 16C shows a cross-sectional view across the line AA' of the same device as shown in FIG. 15C.

FIG. 16C shows a cross-sectional view 1800C across the line AA' 302 of the same device as shown in FIG. 15C, i.e. the device resulting from the process 1700C. The cross-sectional view 1700C may appear to be identical to the cross-sectional view 1700B, indicating that the process 1700C partially removes the dielectric material 1410 only from within the trenches 350 such that the cross-sectional profile along the line AA' 302 remains unchanged.

Figure 16D:
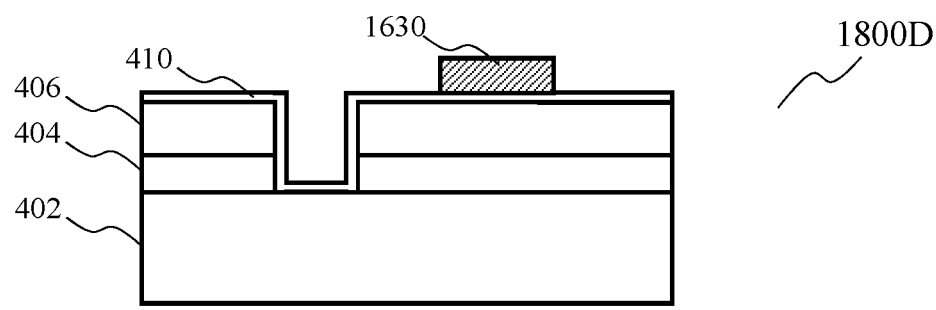
FIG. 16D shows a cross-sectional view across the line AA' of the same device as shown in FIG. 15D.

FIG. 16D shows a cross-sectional view 1800D across the line AA' 302 of the same device as shown in FIG. 15D, i.e. the device resulting from the process 1700D.

According to various embodiments, the electrode component 330 may be connected to the source terminal 310. Any one of the transistors 300, 400, 700, 1000, 1300 or 1600 may include a metallization layer 1902. The metallization layer 1902 may include a metal contact 1904 that connects the source terminal 310 to the electrode component 330.

Figure 17:
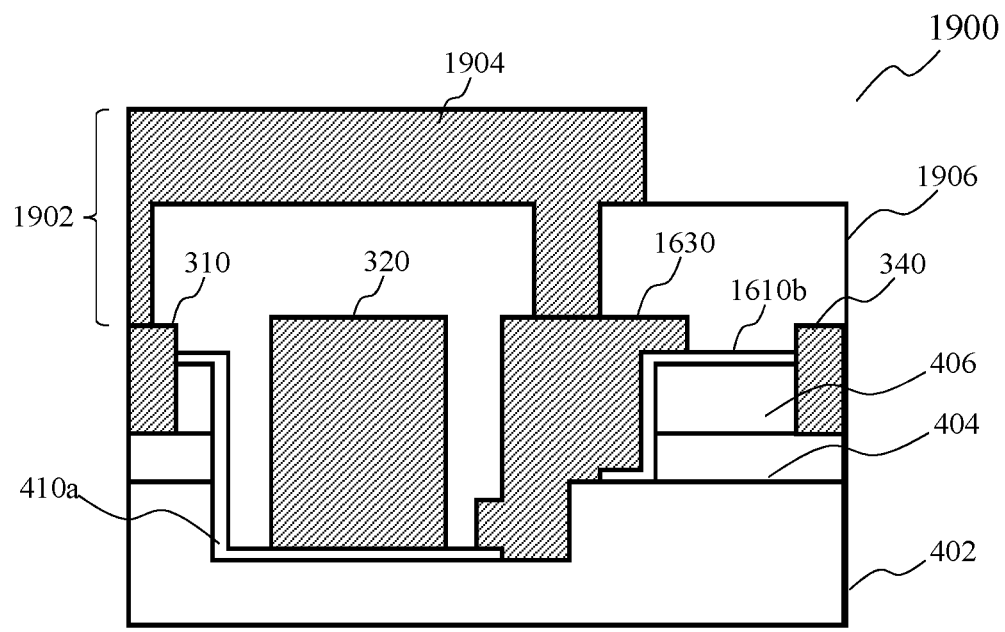
FIG. 17 shows a cross-sectional view of a transistor according to various embodiments, cut across the line BB'.

FIG. 17 shows a cross-sectional view of a transistor 1900 according to various embodiments, cut across the line BB' 304. The transistor 1900 may include the transistor 1600, an inter-level dielectric (ILD) layer 1906 formed over the transistor 1600, and the metallization layer 1902. The metallization layer 1902 may include the metal contact 1904. The metal contact 1904 may be partially formed over the ILD layer 1906 and may extend through the ILD layer 1906 to connect the source terminal 310 to the electrode 1630.

Figure 18:
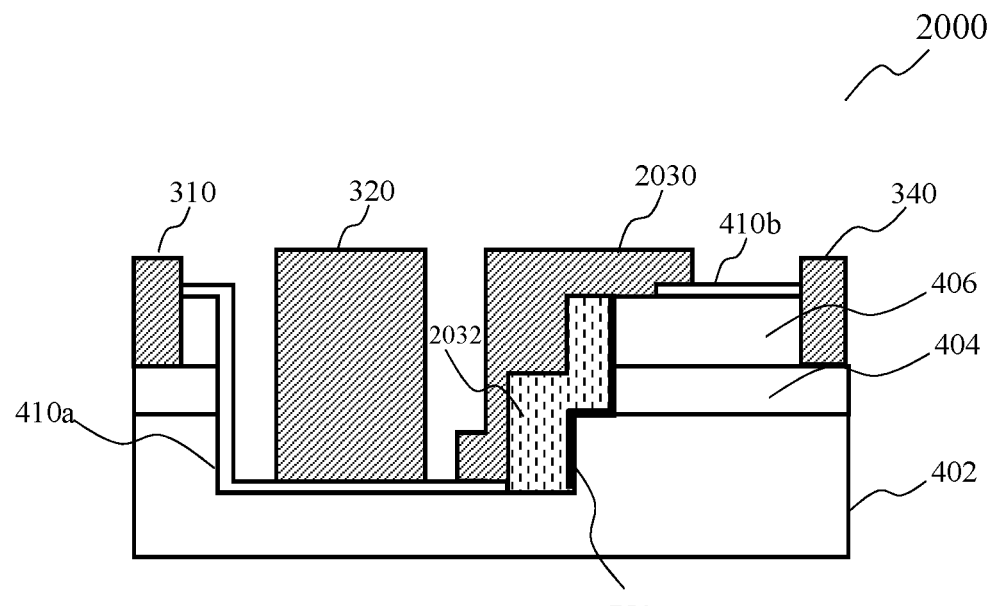
FIG. 18 shows a cross-sectional view of a transistor according to various embodiments, cut across the line BB'.

FIG. 18 shows a cross-sectional view of a transistor 2000 according to various embodiments, cut across the line BB' 304. The transistor 2000 may be an embodiment of the transistor 300. The transistor 2000 may be structurally similar to the transistor 1300, but may include a p-n diode instead of a SBD. The p-n diode may include an electrode component. The electrode component may include an electrode 2030 and a doped semiconductor region 2032. The electrode may include a metal member 2030 that may include nickel, gold, or combinations thereof. The doped semiconductor region 2032 may be selectively grown by metal organic chemical vapor deposition. The doped semiconductor region 2032 may have a p-type conductivity. The doped semiconductor region 2032 may be disposed between the metal member 2030 and the side wall 750. The doped semiconductor region 2032 may be adjacent to the metal member 2030 and may be in contact with the side wall 750. The transistor 2000 may include trenches 350. Each trench may have a side wall 750 that has a stepped cross-sectional profile. The doped semiconductor region 2032 may be formed against the stepped side wall 750. The doped semiconductor region 2032 may be in direct contact with a portion of the buffer layer 402 that protrudes out under the barrier layer 404.

Figure 19:
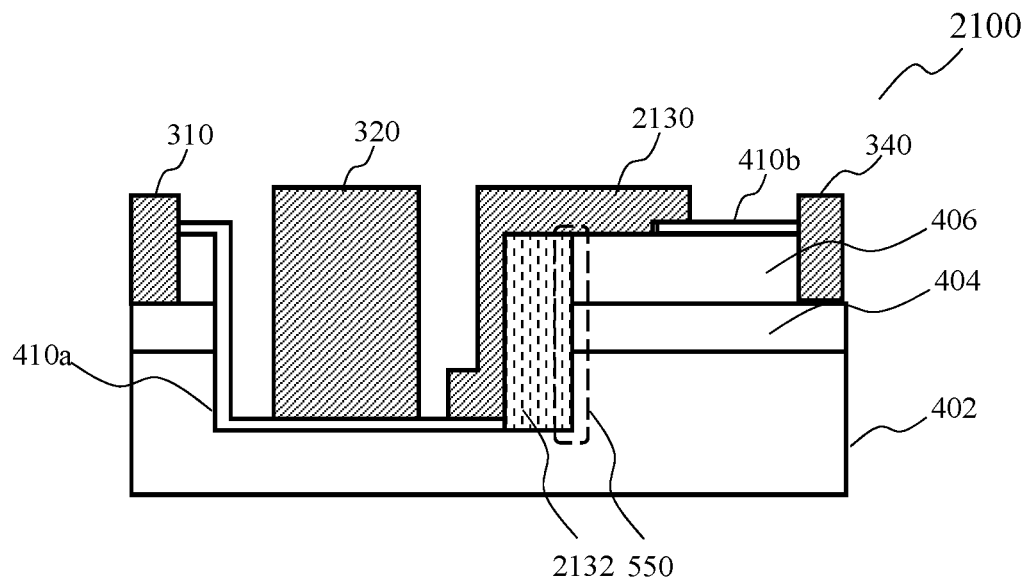
FIG. 19 shows a cross-sectional view of a transistor according to various embodiments, cut across the line BB'.

FIG. 19 shows a cross-sectional view of a transistor 2100 according to various embodiments, cut across the line BB' 304. The transistor 2100 may be an embodiment of the transistor 300. The transistor 2100 may be structurally similar to the transistor 1000, but may include a p-n diode instead of a SBD. The p-n diode may include an electrode component. The electrode component may include an electrode and a doped semiconductor region 2132. The electrode may include a metal member 2130. The transistor 2100 may include trenches 350. Each trench may have a side wall 550 that is at least substantially vertical and planar. The doped semiconductor region 2132 may be disposed between the metal member 2130 and the side wall 550.

Figure 20:
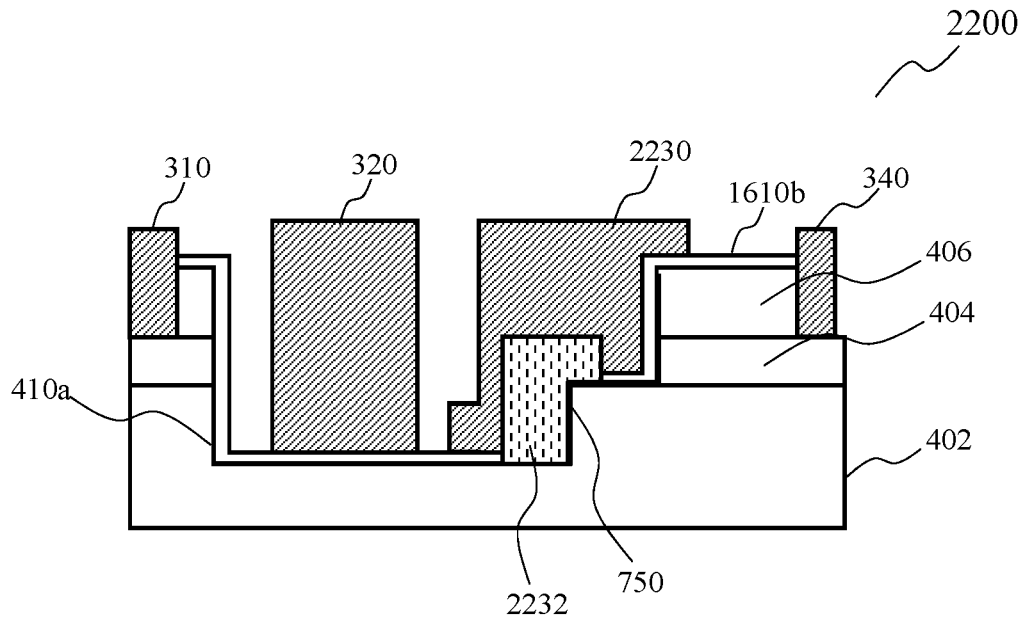
FIG. 20 shows a cross-sectional view of a transistor according to various embodiments, cut across the line BB'.

FIG. 20 shows a cross-sectional view of a transistor 2200 according to various embodiments, cut across the line BB' 304. The transistor 2200 may be an embodiment of the transistor 300. The transistor 2200 may be structurally similar to the transistor 1600, but may include a p-n diode instead of a SBD. The p-n diode may include an electrode component that includes an electrode and a doped semiconductor region 2232. The electrode may include a metal member 2230. The transistor 2200 may include trenches 350. Each trench may have a side wall 750 that has a stepped cross-sectional profile. The doped semiconductor region 2032 may be formed against the stepped side wall 750. The doped semiconductor region 2032 may be in direct contact with a portion of the buffer layer 402 that protrudes out under the barrier layer 404. Like in the transistor 1600, the transistor 2200 may include a dielectric layer that includes a first dielectric region 410a and a second dielectric region 1610b. The second dielectric region 1610b may line part of the side wall 750, adjacent to the passivation layer 406 and the barrier layer 404. The second dielectric region 1610b may also partially overlap the access region channel at the interface between the buffer layer 402 and the barrier layer 404. The second dielectric region 1610b in the transistor 1600 may be partially disposed between the electrode 1630 and the side wall 750.

Figure 21A:
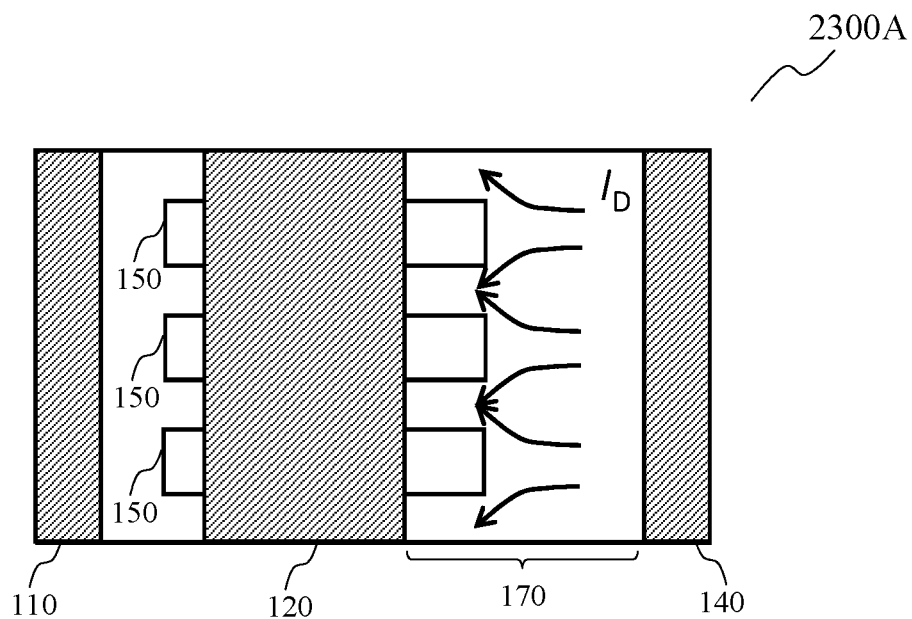
FIG. 21A shows a current path diagram of a prior art transistor.

FIG. 21A shows a current path diagram of a prior art transistor. The electrical current path is indicated by arrows labeled "ID". The current flow from the access region 170 may be separated into several parts that travel in between the trenches 150 to reach the gate terminal 120. The access region 170 adjacent to the trench 150 may not conduct current.

Figure 21B:
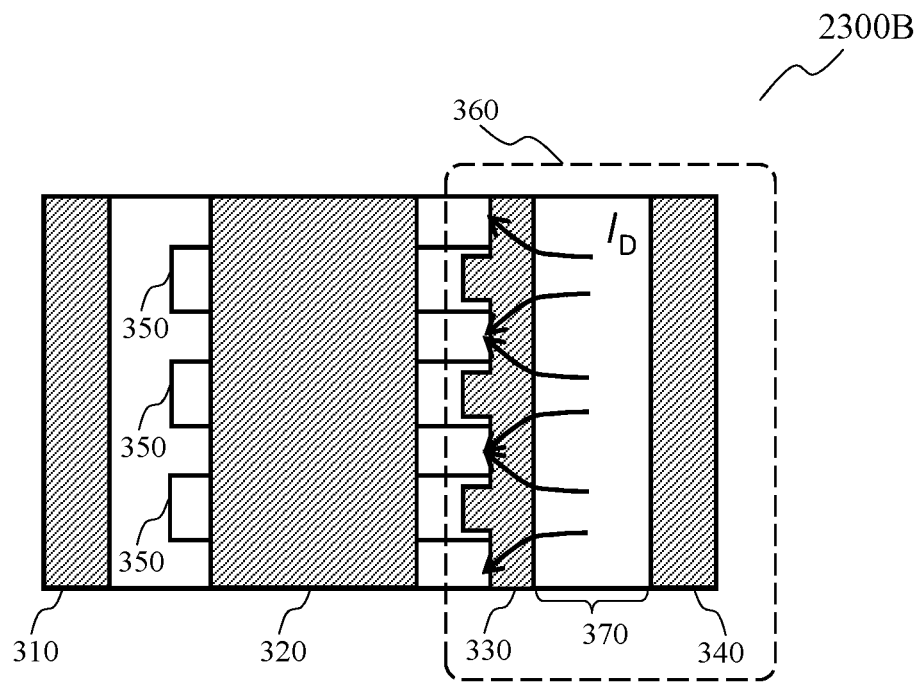
FIG. 21B shows a current path diagram of a transistor according to various embodiments.

FIG. 21B shows a current path diagram of the transistor 300 according to various embodiments. The electrical current path is indicated by arrows labeled "ID". The current path of the transistor 300 may be similar to the current path of a prior art transistor. In other words, the diode 360 does not affect the current path and as such, may not degrade the total on-resistance of the transistor 300.

Figure 22:
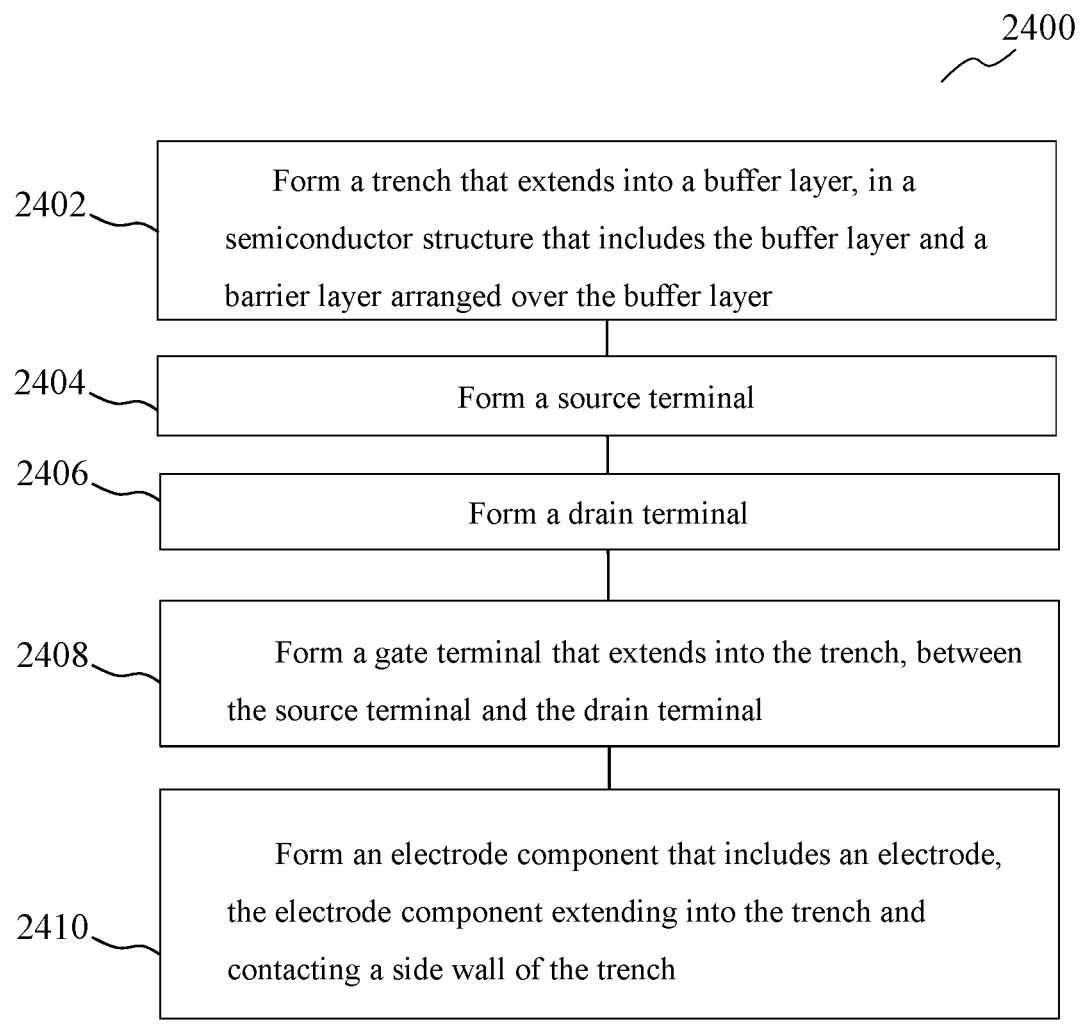
FIG. 22 shows a flow diagram of a method for forming a transistor according to various embodiments.

FIG. 22 shows a flow diagram 2400 of a method for forming a transistor according to various embodiments. The method may include forming a trench in a semiconductor structure, in 2402. The semiconductor structure may include a buffer layer and a barrier layer arranged over the buffer layer. The trench may extend partially into the buffer layer. The semiconductor structure may be the base structure 502. The method may include forming a source terminal, in 2404. The method may include forming a drain terminal, in 2406. The method may include forming a gate terminal between the source terminal and the drain terminal, in 2408. The gate terminal may extend into the trench. The method may include forming an electrode component, in 2410. The electrode component may include an electrode. The electrode component may extend into the trench where the electrode component may be separated from the gate terminal. The electrode component may be in contact with a side wall of the trench. The side wall may lie between the gate terminal and the drain terminal.

According to various embodiments, forming the electrode may include depositing a metallic material into the trench, and etching the metallic material. Forming the electrode may include one of the processes 500B, 800B, 1100B, 1400D, or 1700D.

According to various embodiments, forming the electrode component may include forming a doped semiconductor member adjacent to the side wall. The resulting transistor device may be any one of the transistor devices 2000, 2100 or 2200.

According to various embodiments, forming the trench may include etching the barrier layer such that the barrier layer is recessed relative to the buffer layer along the side wall, for example, in one of the processes 800A, 1400A, or 1700A.

According to various embodiments, the method of forming the transistor may further include depositing a dielectric material in the trench to form a gate dielectric layer lining inner surfaces of the trench, before forming the gate terminal, for example, in one of the processes 1100A, 1400B, or 1700B. Part of the dielectric layer in contact with the side wall may be removed, before forming the electrode, for example, in one of the processes 1100A, 1400C, or 1700C.

According to various embodiments, a method for manufacturing a built-in diode in III-Nitride transistor to provide enhanced reverse conduction performance may be provided. The III-Nitride transistor may include a barrier layer, a buffer layer and a passivation layer. A two-dimensional electron gas may be formed at the interface between the barrier layer and the buffer layer for conducting current. In addition, a transistor may include a semiconductor structure having a trench formed therein according to various embodiments. The trench may extend at least to the buffer layer. The transistor device may include a source terminal, a drain terminal, and a gate terminal arranged between the source terminal and the drain terminal. The gate terminal may extend into the trench. The transistor device may include an electrode component that extends into the trench. The electrode component may contact a side wall of the trench. The electrode component may include as an anode of a diode and may connect to source or stay independent, and the drain terminal of the transistor may work as cathode. Thus, a built-in diode is formed to enhance the reverse conduction performance of a III-Nitride transistor. While embodiments of the invention have been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced. It will be appreciated that common numerals, used in the relevant drawings, refer to components that serve a similar or the same purpose.

It will be appreciated to a person skilled in the art that the terminology used herein is for the purpose of describing various embodiments only and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims.

The invention claimed is:

1. A transistor device comprising:
    a semiconductor structure having a trench formed therein, the semiconductor structure comprising a buffer layer and a barrier layer arranged over the buffer layer, the trench at least extending to the buffer layer;
    a source terminal, a drain terminal, and a gate terminal arranged between the source terminal and the drain terminal, wherein the gate terminal extends into the trench; and
    an electrode component comprising an electrodes;
    wherein the electrode component extends into the trench where the electrode component is separated from the gate terminal, wherein the electrode component contacts a side wall of the trench, and
    wherein the electrode component further comprises a doped semiconductor member that contacts the side wall of the trench, and wherein the electrode comprises a metal member adjacent to the doped semiconductor member.

2. The transistor device of claim 1, wherein the side wall of the trench lies between the gate terminal and the drain terminal.

3. The transistor device of claim 1, wherein the electrode is an anode of an integrated diode, and wherein the drain terminal is a cathode of the integrated diode.

4. The transistor device of claim 3, wherein the integrated diode is a Schottky barrier diode or a p-n diode.

5. The transistor device of claim 1, wherein a portion of the buffer layer protrudes into the trench from the side wall, relative to the barrier layer.

6. The transistor device of claim 1, wherein the semiconductor structure further comprises a passivation layer at least partially arranged over the barrier layer, the passivation layer comprising a dielectric material.

7. The transistor device of claim 6, wherein a portion of the buffer layer protrudes into the trench from the side wall, relative to the passivation layer.

8. The transistor device of claim 1, further comprising:
a dielectric layer comprising a dielectric material, wherein a first portion of the dielectric layer is arranged under the gate terminal.

9. The transistor device of claim 8, wherein a further portion of the dielectric layer partially lines the side wall.

10. The transistor device of claim 9, wherein the further portion of the dielectric layer terminates by contacting the doped semiconductor member of the electrode component.

11. The transistor device of claim 8, wherein a second portion of dielectric layer is partially arranged under the metal member of the electrode component.

12. The transistor device of claim 8, wherein the first portion of the dielectric layer terminates by contacting the doped semiconductor member of the electrode component.

13. The transistor device of claim 1, wherein the semiconductor structure has a plurality of trenches formed therein, each trench extending partially into the buffer layer,
wherein the gate terminal extends into each trench of the plurality of trenches,
wherein the electrode extends into each trench of the plurality of trenches, the electrode being in contact with a respective side wall of each trench that lies between the gate terminal and the drain terminal.

14. The transistor device of claim 1, wherein the barrier layer comprises AlGaN, AlN, InAlN, GaN, or combinations thereof.

15. The transistor device of claim 1, wherein the electrode component further comprises a protrusion that extends away from the side wall and into the trench.

16. The transistor device of claim 1, wherein the doped semiconductor member of the electrode component partially contacts the side wall and the metal member of the electrode component also partially contacts the side wall.

17. The transistor device of claim 1, wherein the metal member covers a side and top of the doped semiconductor member.

18. A method of forming a transistor device, the method comprising:
forming a trench in a semiconductor structure, wherein the semiconductor structure comprises a buffer layer and a barrier layer arranged over the buffer layer, the trench extending partially into the buffer layer;
forming a source terminal;
forming a drain terminal;
forming a gate terminal between the source terminal and the drain terminal, the gate terminal extending into the trench;
forming an electrode component that comprises an electrode, the electrode component extending into the trench where the electrode component is separated from the gate terminal, wherein the electrode component contacts a side wall of the trench;
depositing a metallic material into the trench; and
etching the metallic material,
wherein the electrode component further comprises a doped semiconductor member that contacts the side wall of the trench, and wherein the electrode comprises a metal member adjacent to the doped semiconductor member.

19. The method of claim 18, further comprising:
depositing a dielectric material in the trench to form a dielectric layer lining inner surfaces of the trench, before forming the gate terminal.

20. The method of claim 19, further comprising:
removing part of the dielectric layer in contact with the side wall, before forming the electrode.

* * * * *